United States Patent
Jiang et al.

(10) Patent No.: US 11,645,441 B1
(45) Date of Patent: May 9, 2023

(54) MACHINE-LEARNING BASED CLUSTERING FOR CLOCK TREE SYNTHESIS

(71) Applicant: Cadence Design Systems, Inc., San Jose, CA (US)

(72) Inventors: Bentian Jiang, Shatin (HK); Natarajan Viswanathan, Austin, TX (US); Zhuo Li, Austin, TX (US); Yi-Xiao Ding, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 296 days.

(21) Appl. No.: 17/139,657

(22) Filed: Dec. 31, 2020

(51) Int. Cl.
   *G06F 30/3312* (2020.01)
   *G06N 20/00* (2019.01)
   *G06F 1/06* (2006.01)

(52) U.S. Cl.
   CPC .......... *G06F 30/3312* (2020.01); *G06F 1/06* (2013.01); *G06N 20/00* (2019.01)

(58) Field of Classification Search
   CPC ........ G06F 30/3312; G06F 1/06; G06N 20/00
   See application file for complete search history.

(56) References Cited

U.S. PATENT DOCUMENTS 8,677,299 B1 * 3/2014 Alpert ................ G06F 30/34
716/118

OTHER PUBLICATIONS

"Clock Power Minimization using Structured Latch Template and Decision Tree Induction", by Samuel I. Wardy, Natarajan Viswanathanz, Nancy Y. Zhouz, Cliff C. N. Szez, Zhuo Liz, Charles J. Alpertz, David Z. Pany, IEEE @2013.*

* cited by examiner

*Primary Examiner* — Nha T Nguyen
(74) *Attorney, Agent, or Firm* — Schwegman Lundberg & Woessner, P.A.

(57) ABSTRACT

Aspects of the present disclosure address systems and methods for performing a machine-learning based clustering of clock sinks during clock tree synthesis. An integrated circuit (IC) design comprising a clock net that includes a plurality of clock sinks is accessed. An initial number of clusters to generate from the set of clock sinks is determined using a machine-learning model. A first set of clusters is generated from the set of clocks sinks and includes the initial number of clusters. A timing analysis is performed to determine whether each cluster in the first set of clusters satisfies design rule constraints. The initial number of clusters is adjusted based on the timing analysis and a clustering solution is generated based on the adjusted number of clusters.

20 Claims, 5 Drawing Sheets

MACHINE-LEARNING BASED CLUSTERING FOR CLOCK TREE SYNTHESIS

TECHNICAL FIELD

The present disclosure generally relates to the technical field of integrated circuit (IC) design. In particular, the present disclosure addresses systems and methods for designing a clock tree for an IC.

BACKGROUND

An IC layout specifies portions of various components of an IC. When the IC is to include a large number of registers, latches, flip-flops, and/or other types of clocked devices ("sinks") that are to be clocked by one or more clocks, the IC must include one or more clock trees for delivering the clock signal from the clock source to all of the sinks to be clocked by it. A clock tree distributes a clock signal from its root to a set of sinks within an IC through a branching network of fan-out buffers, clock gates, and/or other types of clock logic (collectively referred to hereinafter as "clock nodes"). A clock tree includes a hierarchy of fan-out buffers (which may or may not invert the clock signal), clock gates, and/or clock logic for fanning the clock tree out from one or more buffers at a top level of the hierarchy to a large number of buffers or clock gates at the lowest level of the hierarchy that drive the clock inputs of the sinks.

After establishing positions of all clock nodes and routing signal paths between the clock nodes and the sinks, a clock tree synthesis (CTS) tool estimates the path delays from the clock tree root to all sinks and then inserts additional buffers into various branches of the clock tree as needed to reduce variations in path delays to the sinks, thereby balancing the clock tree. Conventional approaches to positioning fan-out buffers involve grouping sinks in a process referred to as "clustering." During clustering, sinks are grouped into a set of clusters such that each cluster has no more than the number of sinks that can be driven by a single fan-out buffer, Sinks are typically clustered using one of two approaches: a geometry-based approach and a load-based approach.

In an example of the conventional geometry-based approach to clustering, sinks are grouped into clusters such that the clusters have approximately equal spans. In an example of the conventional load-based approach to clustering, sinks are grouped into clusters such that the clusters have approximately equal loads (e.g., total pin and wire capacitance). In both approaches, reclustering may be iteratively performed until design rule constraints are satisfied. Conventional techniques either explicitly split clusters that fail design rule constraints or increase the number of clusters and perform a global reclustering pass until all clusters satisfy design constraints. Further, at each clustering iteration, a timing analysis is performed to evaluate clusters to ensure that design constraints are satisfied, and if they are not, an additional iteration is performed to generate a new set of clusters. In many instances, several iterations of reclustering are performed to reach a clustering solution in which all clusters satisfy the design rule constraints. However, evaluating clusters at each iteration, especially when there are a large number of sinks in the design, can be overly time consuming and computationally expensive in terms of computing resources that are utilized.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Figure 1:
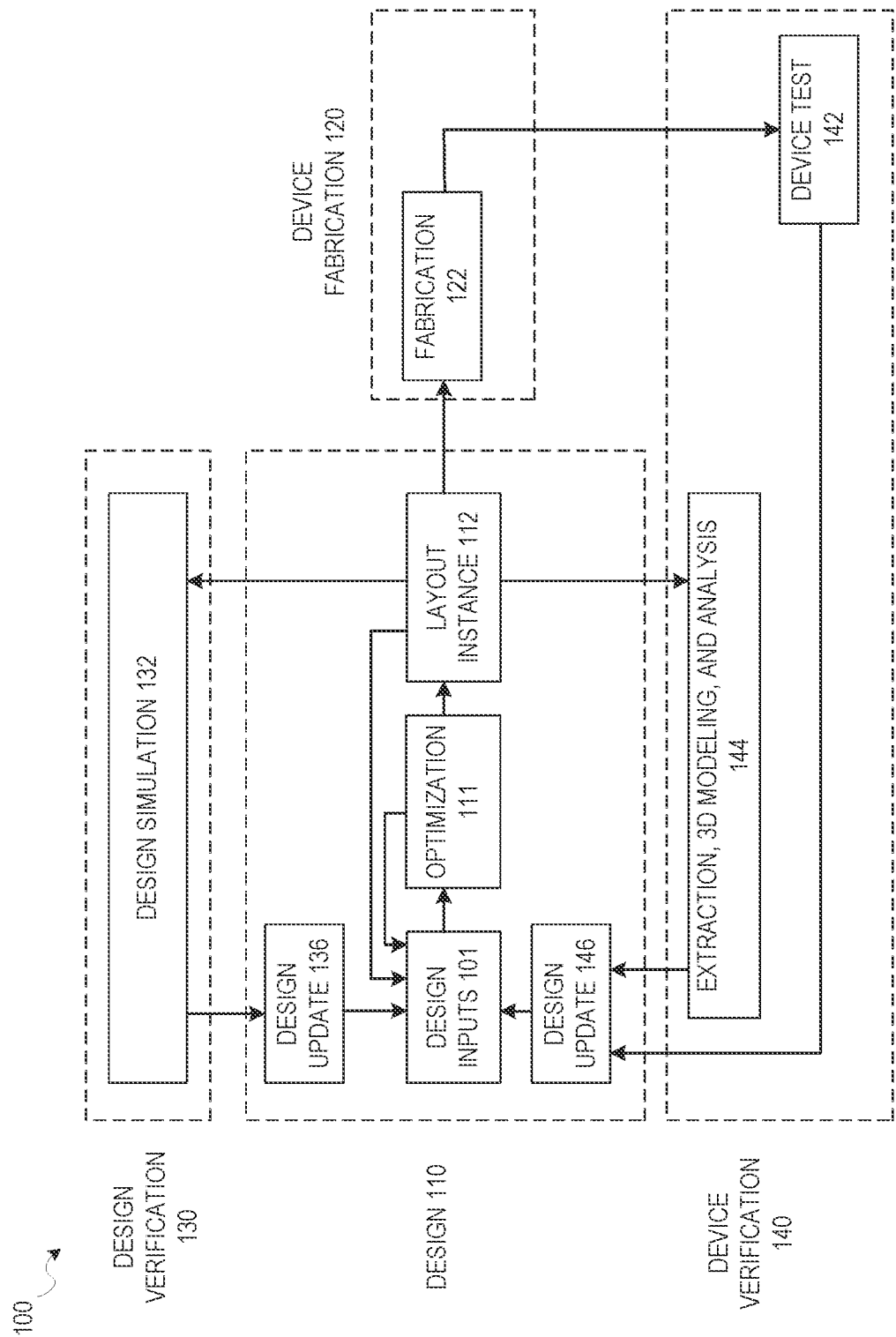
FIG. 1 is a diagram illustrating a possible design process flow that includes a machine-learning based method for clustering clock objects during CTS, according to some example embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

As noted above, traditional techniques for clustering involve multiple iterations using an increasing number of clusters, which can be overly time consuming and computationally expensive. Aspects of the present disclosure address the deficiencies of conventional clustering techniques by using a machine-learning model to predict an initial number of clusters to generate from a set of clock sinks that result in all clusters satisfying design rule constraints. A machine-learning algorithm may be used to train and generate the machine-learning model in an offline processing using training data that includes clusters labeled according to their satisfaction of design rule constraints (e.g., "Passing" or "Failing"). In training the machine-learning model, the machine-learning algorithm utilizes the training data to find correlations among features that affect whether clusters satisfy design rule constraints. These features may, for example, include driver location, driver size, input slew of driver, number of sinks, sink sizes, sink locations, bounding box area, average net radius, routing topology, total wirelength, and resistance and capacitance characteristics.

At runtime, the machine-learning model is used to predict a number of clusters, K, to generate from clock sinks of a given clock net. An initial set of clusters is generated by grouping the dock sinks of the clock net, The initial set of clusters includes K clusters. A timing analysis is performed to evaluate whether each cluster in the initial set of clusters satisfies design rule constraints. The design rule constraints may set forth timing and loading targets such as targets for transition, skew, and total capacitance of clusters. The number of clusters, K, is adjusted based on the result of the timing analysis. A clustering solution for the clock net is generated based on the adjusted K.

As an example of the adjustment to K, if all clusters in the initial set of clusters satisfy the design rule constraints, K is decremented until it is determined that at least one cluster fails to satisfy design constraints. The K used in the previous iteration is selected as the adjusted K. In another example, if at least one cluster in the set of clusters fails to satisfy the one or more design rule constraints, K is incremented until it is determined that each cluster satisfies the one or more design rule constraints.

Using the machine-learning model to predict the initial number of clusters reduces the number of iterations that are necessary to reach a clustering solution in which all clusters satisfy design rule constraints. As noted above, at each iteration, clusters are evaluated by performing a timing analysis. Thus, the use of the machine-learning model in predicting the initial number of clusters significantly reduces the computational overhead required to generate the clustering solution by eliminating multiple unnecessary iterations of cluster evaluation.

FIG. 1 is a diagram illustrating one possible design process flow which includes elements for performing clustering to construct a clock tree structure, according to some embodiments. It will be apparent that other design flow operations may function using the timing constraints and optimizations described herein, but a design flow 100 is described here for the purposes of illustration. As illustrated, the design flow 100 includes a design phase 110, a device fabrication phase 120, a design verification phase 130, and a device verification phase 140. The design phase 110 involves an initial design input operation 101 where the basic elements and functionality of a device are determined, as well as revisions based on various analyses and optimization of a circuit design. This design input operation 101 is where a CTS tool generates initial layouts for a clock tree structure and sinks before refinements are made to ensure that timing requirements for each sink are met. The initial layouts for the balanced clock tree structure and sinks include an initial clustering solution for grouping the sinks. The initial strategy, tactics, and context for the device to be created are also generated in the design input operation 101, depending on the particular design algorithm to be used.

In some embodiments, following an initial selection of design values in the design input operation 101, the CTS tool performs clock tree synthesis and associated timing analysis and optimization e.g., refinements to the clock tree structure) according to various embodiments, along with any other automated design processes, at an optimization operation 111. The clock tree synthesis process performed by the CTS tool includes generating a clustering solution by clustering clock sinks. In clustering clock sinks, the CTS tool may use a machine-learning model to determine an initial number of clusters to generate, and the CTS tool may further refine the number of clusters in generating the clustering solution based on an evaluation of the clusters with respect to design rule constraints. Design rule constraints for a clock tree structure may be initiated with design inputs in the design input operation 101, and then may be analyzed using a machine-learning model and subsequent timing analysis according to various embodiments.

While the design flow 100 shows such optimization occurring prior to a layout instance 112, such timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 122. Certain embodiments of operations described herein for generating and refining a clock tree structure may therefore involve iterations of the design input operation 101, optimization operation 111, and layout instance 112 generation. In other systems, other design processes may be used.

After design inputs are used in the design input operation 101 to generate a circuit layout, and any optimization operations 111 (e.g., local refinement transforms) are performed, a layout is generated in the layout instance 112. The layout describes the physical layout dimensions of the device that match the design inputs. This layout may then be used in the device fabrication operation 122 to generate a device, or additional testing and design updates may be performed using designer inputs or automated updates based on design simulation 132 operations, or extraction, three-dimensional (3D) modeling, and analysis 144 operations. Once the device is generated, the device can be tested as part of device test 142 operations and layout modifications generated based on actual device performance.

As described in more detail below, design updates 136 from the design simulation 132 operations; design updates 146 from the device test 142 or extraction, 3D modeling, and analysis 144 operations; or further direct design input operations 101 may occur after an initial layout instance 112 is generated, In various embodiments, whenever design inputs are used to update or change an aspect of a circuit design, a timing analysis and an optimization operation 111 may be performed.

Figure 2:
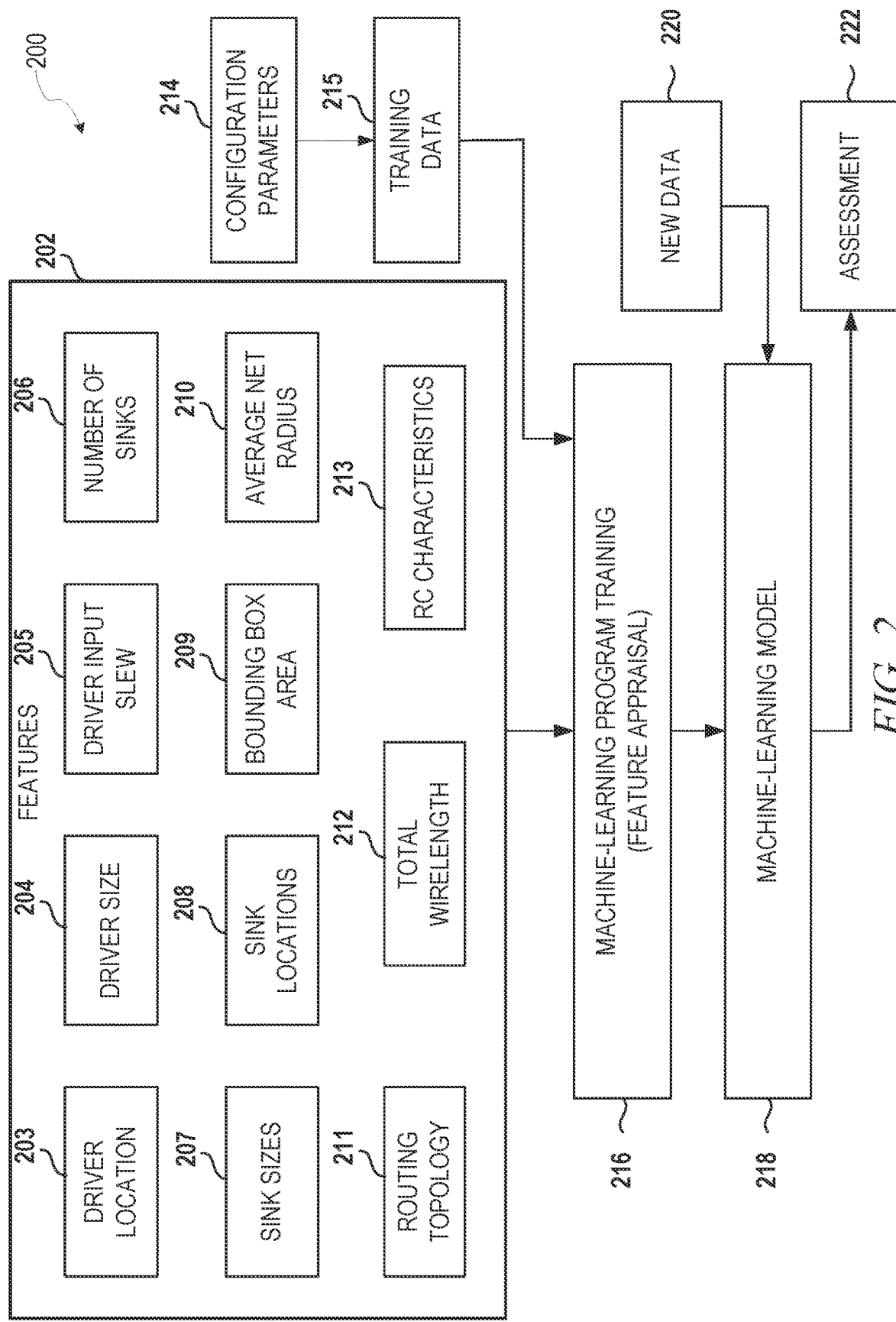
FIG. 2 is a flowchart illustrating operations of a method for generating a machine-learning model for use in clustering clock objects during CTS, according to some embodiments.

FIG. 2 is a flowchart illustrating operations of a method 200 for generating a machine-learning model for use in clustering clock objects during CTS, according to some embodiments. In some example embodiments, machine-learning programs, also referred to as machine-learning algorithms or tools, are utilized to perform operations associated with clustering clock objects during CTS, such as evaluating whether clusters of clock objects satisfy timing constraints.

It will be understood that the method 200 may be performed by a computing device, For example, one or more operations of the method 200 may be represented by executable instructions that, when executed by a processor of a computing device, cause the computing device to perform the method 200. Thus, an operation of the method 200 may be performed by a hardware processor (e.g., central processing unit (CPU) or graphics processing unit (GPU)) of a computing device desktop, server, etc.). Accordingly, the method 200 is described below in reference to such a computing device.

Machine-learning is an application that provides computer systems the ability to perform tasks, without explicitly being programmed, by making inferences based on patterns found in the analysis of data. Machine-learning explores the study and construction of algorithms, also referred to herein as tools, that may learn from existing data and make predictions about new data. Such machine-learning algorithms operate by building a machine-learning model 218 from example training data 215 in order to make data-driven predictions or decisions expressed as outputs or assessments 222. Although example embodiments are presented with respect to a few machine-learning tools, the principles presented herein may be applied to other machine-learning tools.

Data representation refers to the method of organizing the data for storage on a computer system, including the structure for the identified features and their values. In machine-learning, it is typical to represent the data in vectors or matrices of two or more dimensions, When dealing with large amounts of data and many features, data representation is important so that the training is able to identify the correlations within the data.

There are two common modes for machine-learning: supervised machine-learning and unsupervised machine-learning. Supervised machine-learning uses prior knowledge (e.g., examples that correlate inputs to outputs or outcomes) to learn the relationships between the inputs and the outputs. The goal of supervised machine-learning is to learn a function that, given some training data, best approximates the relationship between the training inputs and outputs so that the machine-learning model can implement the same relationships when given inputs to generate the corresponding outputs. Unsupervised machine-learning is the training of an machine-learning algorithm using information that is neither classified nor labeled and allowing the algorithm to act on that information without guidance. Unsupervised machine-learning is useful in exploratory analysis because it can automatically identify structure in data.

Common tasks for supervised machine-learning are classification problems and regression problems. Classification problems, also referred to as categorization problems, aim at classifying items into one of several category values (for example, whether an object is an apple or an orange). Regression algorithms aim at quantifying some items (for example, by providing a score to the value of some input). Some examples of commonly used supervised-machine-learning algorithms are Logistic Regression (LR), Naive-Bayes, Random Forest (RF), neural networks (NN), deep neural networks (DNN), matrix factorization, and Support Vector Machines (SVM).

Some common tasks for unsupervised machine-learning include clustering, representation learning, and density estimation. Some examples of commonly used unsupervised-machine-learning algorithms are K-means clustering, principal component analysis, and autoencoders.

In some embodiments, example machine-learning model 218 provides an assessment (prediction) of a number of clusters to generate from a set of clock objects such that each cluster satisfies design rule constraints such as a timing target.

The training data 215 comprises examples of values for a set of features 202. In some example embodiments, the training data comprises labeled data with examples of values for the features 202 and labels indicating the outcome. The labeled data includes clusters of clock sinks and the labels indicate outcomes, such as whether clusters are "Passing" or "Failing" based on whether the clusters satisfy design rule constraints. That is, clusters in the training data may be labeled as "Passing" if they satisfy design rule constraints and "Failing" if they do not satisfy design rule constraints. In an example, a given cluster's category is determined based on a comparison of timing characteristics of the cluster with a timing target.

The machine-learning algorithms utilize the training data 215 to find correlations among identified features 202 that affect the outcome. A feature 202 is an individual measurable property of a phenomenon being observed. The concept of a feature is related to that of an explanatory variable used in statistical techniques such as linear regression. Choosing informative, discriminating, and independent features is important for effective operation of machine-learning in pattern recognition, classification, and regression. Features may be of different types, such as numeric features, strings, and graphs.

Feature extraction is a process to reduce the amount of resources required to describe a large set of data. When performing analysis of complex data, one of the major problems is one that sterns from the number of variables involved. Analysis with a large number of variables generally requires a large amount of memory and computational power, and it may cause a classification algorithm to overfit to training samples and generalize poorly to new samples. Feature extraction includes constructing combinations of variables to get around these large-data-set problems while still describing the data with sufficient accuracy for the desired purpose.

In some example embodiments, feature extraction starts from an initial set of measured data and builds derived values (features) intended to be informative and non-redundant, facilitating the subsequent learning and generalization steps. Further, feature extraction is related to dimensionality reduction, such as reducing large vectors (sometimes with very sparse data) to smaller vectors capturing the same, or a similar, amount of information.

In one example embodiment, the features 202 may be of different types and may include one or more of driver location 203, driver size 204, input slew of driver 205, number of sinks 206, sink sizes 207, sink locations 208, bounding box area 209, average clock net radius 210, routing topology 211, total wirelength 212, and resistance and capacitance characteristics 213.

During training 216, the machine-learning algorithm analyzes the training data 215 based on identified features 202 and configuration parameters 214 defined for the training. The result of the training 216 is an machine-learning model 218 that is capable of taking inputs to produce assessments.

Training an machine-learning algorithm involves analyzing large amounts of data (e.g., from several gigabytes to a terabyte or more) in order to find data correlations. The machine-learning algorithms utilize the training data 215 to find correlations among a set of identified features 202 that affect the outcome or assessment 222. In some example embodiments, the training data 215 includes labeled data, which is known data for one or more identified features 202 and one or more outcomes such as whether clusters are passing or failing in relation to their satisfaction of timing target constraints.

The machine-learning algorithms usually explore many possible functions and parameters before finding what the machine-learning algorithms identify to be the best correlations within the data; therefore, training may require large amounts of computing resources and time.

Many machine-learning algorithms include configuration parameters 214, and the more complex the machine-learning algorithm, the more parameters there are that are available to the user. The configuration parameters 214 define variables for an machine-learning algorithm in the search for the best machine-learning model. The training parameters include model parameters and hyperparameters. Model parameters are learned from the training data, whereas hyperparameters are not learned from the training data but instead are provided to the machine-learning algorithm.

Some examples of model parameters include maximum model size, maximum number of passes over the training data, data shuffle type, regression coefficients, decision tree split locations, and the like. Hyperparameters may include the number of hidden layers in a neural network, the number of hidden nodes in each layer, the learning rate (perhaps with various adaptation schemes for the learning rate), the regularization parameters, types of nonlinear activation functions, and the like. Finding the correct (or the best) set of hyperparameters can be a very time-consuming task that requires a large amount of computer resources.

When the machine-learning model 218 is used to perform an assessment, new data 220 is provided as an input to the machine-learning model 218, and the machine-learning model 218 generates the assessment 222 as output. For example, when clusters of clock objects of a given clock net are evaluated, the machine-learning program utilizes information describing the clock net, the driver, and the sinks to assess whether the clusters satisfy timing target constraints.

Figure 3:
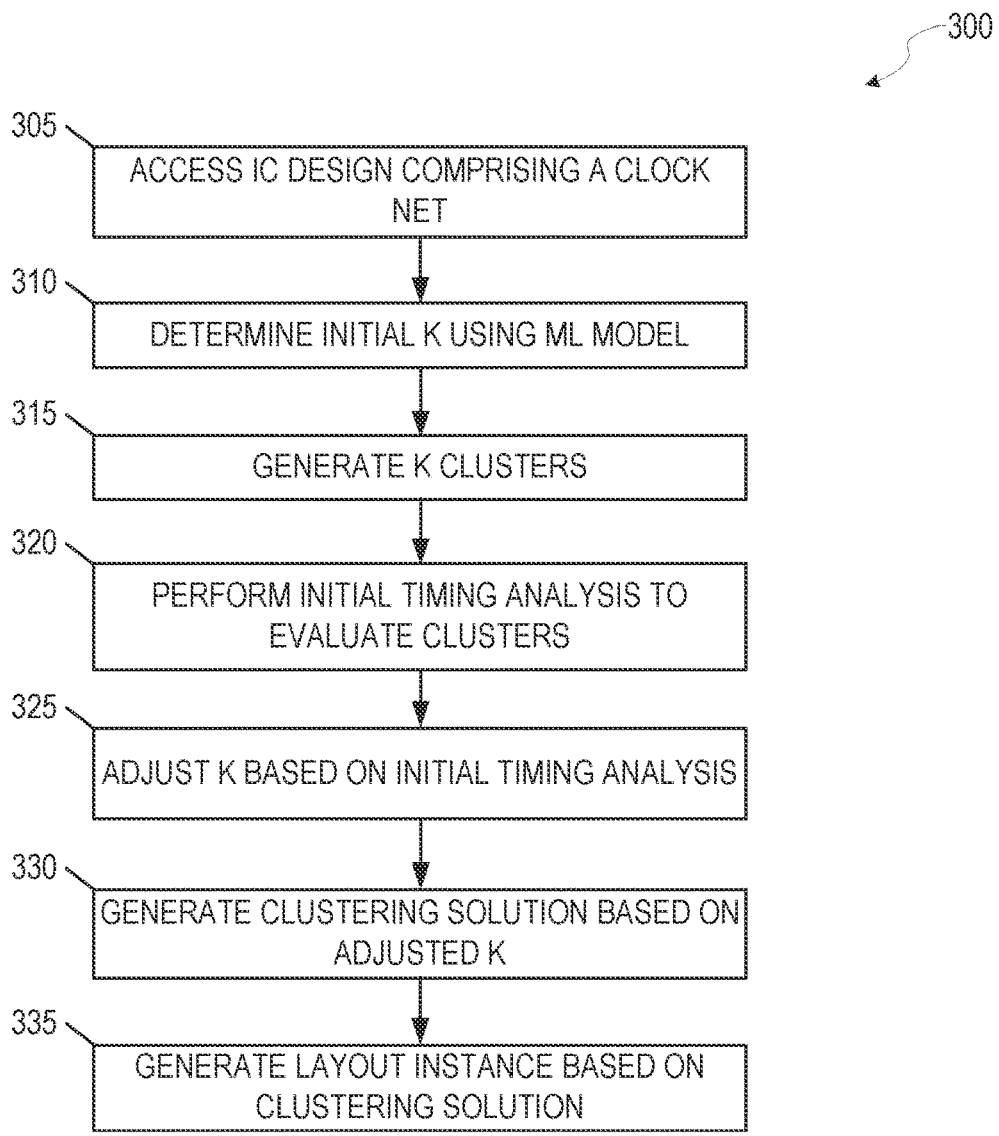
FIGS. 3-4 are flowcharts illustrating operations of a machine-learning based method for clustering clock objects during CTS, according to some embodiments.
Figure 4:
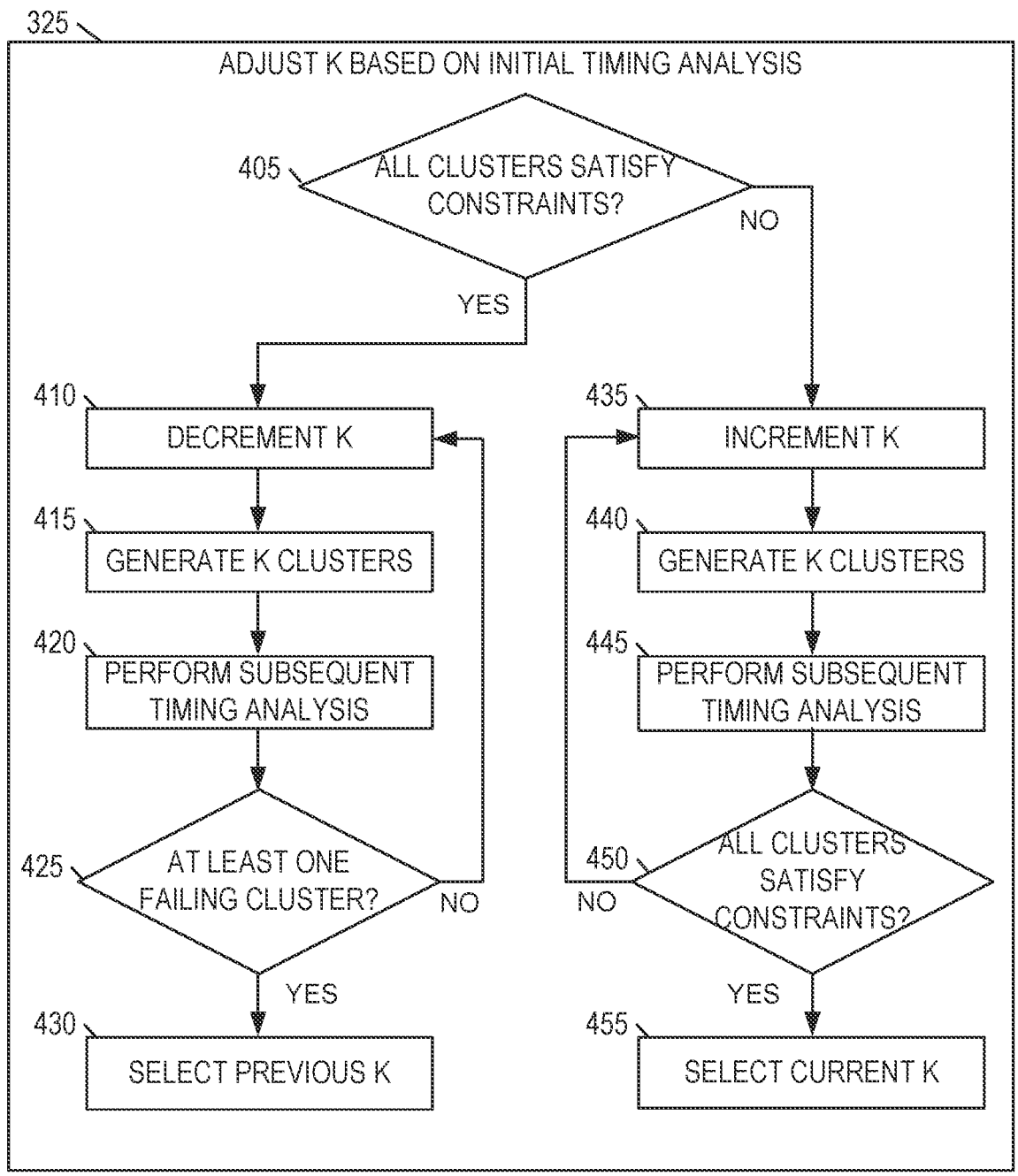

FIGS. 3-4 are flowcharts illustrating operations of a machine-learning based prediction method 300 for clustering clock objects during CTS, according to some embodiments. For some embodiments, the method 200 is performed as part of a place and route process applied to a circuit design (e.g., by an electronic design automation (EDA) software system). More specifically, the method 200 may be performed as part of a CTS process applied to a circuit design.

It will be understood that the method 300 may be performed by a computing device, such as a computing device executing instructions of an EDA software system that includes a CTS tool. For example, the operations of a method 300 may be represented by executable instructions (e.g., EDA software) that, when executed by a processor of a computing device, cause the computing device to perform the method 300. Thus, an operation of the method 300 may be performed by a hardware processor (e.g., central processing unit or graphics processing unit) of a computing device (e.g., desktop, server, etc.). Accordingly, the method 300 is described below in reference to such a computing device.

Depending on the embodiment, an operation of the method 300 may be repeated in different ways or involve intervening operations not shown. Though the operations of the method 300 may be depicted and described in a certain order, the order in which the operations are performed may vary among embodiments, including performing certain operations in parallel.

At operation 305, the computing device accesses an IC design from memory. The IC design comprises a clock net and a set of clock objects (e.g., clock buffers, clock inverters, clock gates, registers, latches, and flip-flops), each of which receives a clock signal.

The computing device, at operation 310, determines an initial number of clusters, K, to generate from the clock sinks of the clock net using a machine-learning model such as the machine-learning model 218. As noted above, the machine-learning model provides the computing device with an assessment that comprises a predicted K that will result in all clusters satisfying design rule constraints.

The computing device generates a set of clusters from the clock objects in the clock net, at operation 315. The set of clusters comprises K clusters. Each cluster comprises a grouping of clock sinks. As an example, the computing device may use a geometry-based approach to clustering where clock sinks are grouped into clusters such that all clusters have approximately equal spans. As another example, the computing device may use a load-based approach to clustering where clock sinks are grouped into clusters such that all clusters have approximately equal loads (e.g., total pin and wire capacitance).

At operation 320, the computing device performs a timing analysis to evaluate the set of clusters. In performing the timing analysis, the computing device uses a timer to measure timing characteristics of each cluster and compares the timing and load characteristics of each cluster with the target timing and load constraints. For example, the computing device may use a timer to analyze each cluster to determine the transition of each cluster and compare the transition of each cluster to a target transition imposed by the design rule constraints. In another example, the computing device may analyze each cluster to determine the skew of each cluster and compare the skew of each cluster to a target skew imposed by the design rule constraints.

The computing device adjusts the number of clusters, K, at operation 325, based on a result of the timing analysis. The adjustment to K by the computing device results in an adjusted K that may be higher, lower, or equal to the initial K. For example, as shown in FIG. 4, the operation 325 may, in some embodiments, include operations 405, 410, 415, 420, 425, 430, 435, 440, 445, 450, and 455 (as a sub-routine or sub-operations).

At operation 405, the computing device determines whether all clusters in the set of clusters satisfy the one or more design rule constraints based on the initial timing analysis. If the computing device determines that all clusters satisfy the design rule constraints, the method 300 proceeds to operation 410 where the computing device decrements K. The computing device then generates a new set of clusters comprising the decremented number of clusters (operation 415) and performs a subsequent timing analysis to evaluate the new set of clusters (operation 420).

The computing device determines, at operation 425, whether at least one cluster in the new set of clusters fails to satisfy the one or more design rule constraints, and if not, the method returns to operation 410 where the computing device again decrements K. This process is repeated until the computing device determines that at least one cluster fails to satisfy the one or more design rule constraints. Upon determining that at least one cluster fails to satisfy the one or more design rule constraints, the computing device selects the previous K number of clusters as the adjusted K, at operation 430. For example, if during a first iteration four clusters are generated from the set of clock sinks and the computing determines that all four clusters satisfy the design rule constraints, and during a second iteration three clusters are generated and the computing device determines that one of the three clusters fails to satisfy the design rule constraints, the computing device selects four as the adjusted number of clusters.

If, at operation 405, the computing device determines that at least one cluster in the initial set of clusters fails to satisfy the one or more design rule constraints, the method 300 proceeds to operation 435 where the computing device increments K. The computing device generates a new set of clusters comprising the incremented number of clusters (operation 440) and performs a subsequent timing analysis to evaluate the new set of clusters (operation 445).

The computing device determines, at operation 450, whether at least all clusters in the new set of clusters satisfy the one or more design rule constraints, and if not, the method returns to operation 435 where the computing device again increments This process is repeated until the computing device determines that all clusters satisfy the one or more design rule constraints. Upon determining that all clusters satisfy the one or more design rule constraints, the computing device selects the current K number of clusters as the adjusted K (operation 455). For example, if during a first iteration four clusters are generated from the set of clock sinks and the computing determines that one of the four clusters fails to satisfy the design rule constraints, and during a second iteration five clusters are generated and the computing device determines that all five clusters satisfy the design rule constraints, the computing device selects five as the adjusted number of clusters.

With reference back to FIG. 3, at operation 330, the computing device generates a clustering solution based on the set of clusters having the adjusted K number of clusters.

The clustering solution defines the adjusted K clusters, each of which comprises a group of clock sinks.

At operation 335, the computing device generates a layout instance of the IC design based on the clustering solution. The layout instance defines physical dimensions of the IC design.

Figure 5:
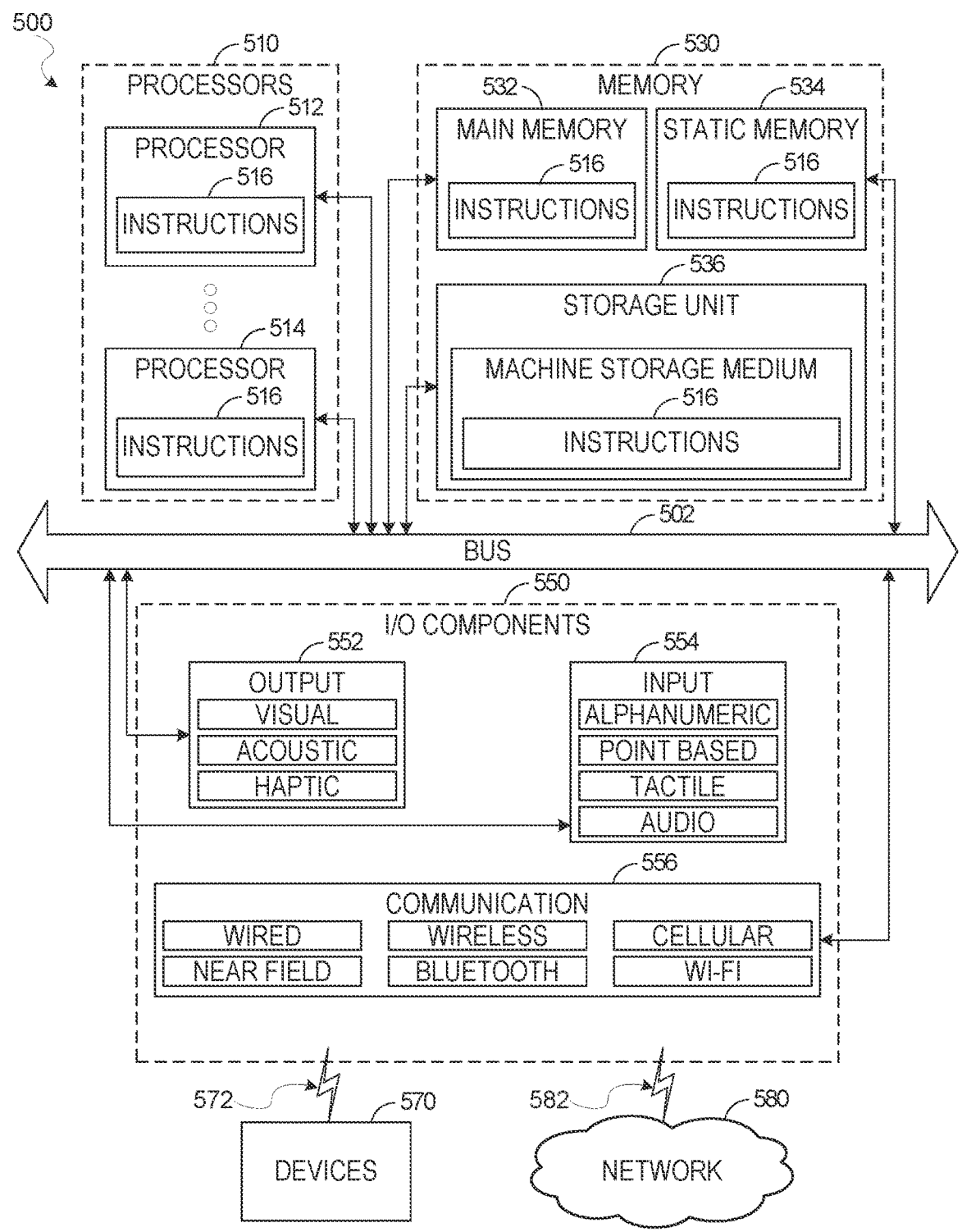
FIG. 5 is a diagrammatic representation of a machine in the example form of a computer system within which a set of instructions for causing the machine to perform any one or more of the methodologies discussed herein may be stored and executed.

FIG. 5 illustrates a diagrammatic representation of a machine 500 in the form of a computer system within which a set of instructions may be executed for causing the machine 500 to perform any one or more of the methodologies discussed herein, according to an example embodiment. Specifically, FIG. 5 shows a diagrammatic representation of the machine 500 in the example form of a computer system, within which instructions 516 (e.g., software, a program, an application, an applet, an app, or other executable code) for causing the machine 500 to perform any one or more of the methodologies discussed herein may be executed. For example, the instructions 516 may cause the machine 500 to execute methods 200 and 300. Additionally, or alternatively, the instructions 516 may implement the design flow 100 of FIG. 1. The instructions 516 transform the general, non-programmed machine 500 into a particular machine 500 programmed to carry out the described and illustrated functions in the manner described here. In alternative embodiments, the machine 500 operates as a stand-alone device or may be coupled (e.g., networked) to other machines. In a networked deployment, the machine 500 may operate in the capacity of a server machine or a client machine in a server-client network environment, or as a peer machine in a peer-to-peer (or distributed) network environment. The machine 500 may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 516, sequentially or otherwise, that specify actions to be taken by the machine 500, Further, while only a single machine 500 is illustrated, the term "machine" shall also be taken to include a collection of machines 500 that individually or jointly execute the instructions 516 to perform any one or more of the methodologies discussed herein.

The machine 500 may include processors 510, memory 530, and I/O components 550, which may be configured to communicate with each other such as via a bus 502. In an example embodiment, the processors 510 (e.g., a CPU, a reduced instruction set computing (RISC) processor, a complex instruction set computing (CISC) processor, a GPU, a digital signal processor (DSP), an application-specific integrated circuit (ASIC), a radio-frequency integrated circuit (RFIC), another processor, or any suitable combination thereof) may include, for example, a processor 512 and a processor 514 that may execute the instructions 516. The term "processor" is intended to include multi-core processors 510 that may comprise two or more independent processors (sometimes referred to as "cores") that may execute instructions contemporaneously. Although FIG. 5 shows multiple processors, the machine 500 may include a single processor with a single core, a single processor with multiple cores (e.g., a multi-core processor), multiple processors with a single core, multiple processors with multiple cores, or any combination thereof.

The memory 530 may include a main memory 532, a static memory 534, and a storage unit 536, all accessible to the processors 510 such as via the bus 502. The main memory 532, the static memory 534, and the storage unit 536 store the instructions 516 embodying any one or more of the methodologies or functions described herein. The instructions 516 may also reside, completely or partially, within the main memory 532, within the static memory 534, within the storage unit 536, within at least one of the processors 510 (e.g., within the processor's cache memory), or any suitable combination thereof, during execution thereof by the machine 500.

The I/O components 550 may include a wide variety of components to receive input, provide output, produce output, transmit information, exchange information, capture measurements, and so on. The specific I/O components 550 that are included in a particular machine will depend on the type of machine. For example, portable machines such as mobile phones will likely include a touch input device or other such input mechanisms, while a headless server machine will likely not include such a touch input device. It will be appreciated that the I/O components 550 may include many other components that are not shown in FIG. 5. The I/O components 550 are grouped according to functionality merely for simplifying the following discussion and the grouping is in no way limiting. In various example embodiments, the I/O components 550 may include output components 552 and input components 554. The output components 552 may include visual components (e.g., a display such as a plasma display panel (PDP), a light-emitting diode (LED) display, a liquid crystal display (LCD), a projector, or a cathode ray tube (CRT)), acoustic components (e.g., speakers), other signal generators, and so forth, The input components 554 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 550 may include communication components 556 operable to couple the machine 500 to a network 580 or devices 570 via a coupling 582 and a coupling 572, respectively. For example, the communication components 556 may include a network interface component or another suitable device to interface with the network 580. In further examples, the communication components 556 may include wired communication components, wireless communication components, cellular communication components, and other communication components to provide communication via other modalities (e.g., near field, Bluetooth, and Wi-Fi). The devices 570 may be another machine or any of a wide variety of peripheral devices (e.g., a peripheral device coupled via a universal serial bus (USB)).

EXECUTABLE INSTRUCTIONS AND MACHINE STORAGE MEDIUM

The various memories (e.g., 530, 532, 534, and/or the memory of the processor(s) 510) and/or the storage unit 536 may store one or more sets of instructions and data structures (e.g., software) embodying or utilized by any one or more of the methodologies or functions described herein. These instructions, when executed by the processor(s) 510, cause various operations to implement the disclosed embodiments.

As used herein, the terms "machine-storage medium," "device-storage medium," and "computer-storage medium"

mean the same thing and may be used interchangeably. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

TRANSMISSION MEDIUM

In various example embodiments, one or more portions of the network 580 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 580 or a portion of the network 580 may include a wireless or cellular network, and the coupling 582 may be a Code Division Multiple Access (CDMA) connection, a Global System for Mobile communications (GSM) connection, or another type of cellular or wireless coupling. In this example, the coupling 582 may implement any of a variety of types of data transfer technology, such as Single Carrier Radio Transmission Technology (1xRTT), Evolution-Data Optimized (EVDO) technology, General Packet Radio Service (CPRS) technology, Enhanced Data rates for GSM Evolution (EDGE) technology, third Generation Partnership Project (3GPP) including 3G. fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 516 may be transmitted or received over the network 580 using a transmission medium via a network interface device (e.g., a network interface component included in the communication components 556) and utilizing any one of a number of well-known transfer protocols (e.g., hypertext transfer protocol (HTTP)). Similarly, the instructions 516 may he transmitted or received using a transmission medium via the coupling 572 (e.g., a peer-to-peer coupling) to the devices 570. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 516 for execution by the machine 500, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

COMPUTER-READABLE MEDIUM

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A system comprising:
   one or more processors of a machine; and
   a computer-storage medium storing instructions, which when executed by the one or more processors, configure the machine to perform operations comprising:
   accessing, from memory, an integrated circuit design comprising a clock net comprising a set of clock sinks;
   determining, using a machine-learning model, an initial number of clusters to generate from the set of clock sinks such that each cluster satisfies one or more design rule constraints;
   generating a first set of clusters from the set of clock sinks of the clock net, the first set of clusters comprising the initial number of clusters;
   performing an initial timing analysis to evaluate the first set of clusters to determine whether each cluster in the first set of clusters satisfies the one or more design rule constraints;
   adjusting the initial number of clusters based on a result of the initial timing analysis, the adjusting of the initial number of clusters comprising decrementing the initial number of clusters based on determining each cluster in the first set of clusters satisfies the one or more design rule constraints, the adjusting of the initial number of clusters resulting in an adjusted number of clusters; and
   generating a clustering solution for the clock net based on the adjusted number of clusters.

2. The system of claim 1, wherein adjusting the initial number of clusters comprises:
   determining whether each cluster in the first set of clusters satisfies the one or more design rule constraints based on the initial timing analysis.

3. The system of claim 1, wherein:
   the adjusting the initial number of clusters further comprises:
   generating a second set of clusters comprising a second number of clusters, the second number of clusters resulting from decrementing the initial number of clusters; and
   based on determining each cluster in the second set of clusters satisfies the one or more design rule constraints, decrementing the second number of clusters.

4. The system of claim 3, wherein the adjusting the initial number of clusters further comprises:
   generating a third set of clusters comprising a third number of clusters, the third number of clusters resulting from decrementing the second number of clusters;
   determining at least one cluster in the third set of clusters fails to satisfy the one or more design rule constraints based on a subsequent timing analysis; and
   based on determining that at least one cluster in the third set of clusters fails to satisfy the one or more design rule constraints, selecting the second number of clusters as the adjusted number of clusters.

5. The system of claim 1, wherein the machine-learning model is generated by using one or more machine-learning algorithms to analyze training data to find correlations among a set of identified features that affect whether clusters satisfy design rule constraints.

6. The system of claim 5, wherein:
   the training data comprises clusters of clock sinks that are labeled according to respective satisfaction of the design rule constraints; and
   the set of identified features includes one or more of: driver location, driver size, input slew of driver, number of sinks, sink sizes, sink locations, bounding box area, average clock net radius, routing topology, total wirelength, and resistance and capacitance characteristics.

7. The system of claim 1, wherein the one or more design rule constraints comprise at least one timing target.

8. The system of claim 1, wherein the operations further comprise generating a layout instance based on the clustering solution, the layout instance defining physical layout dimensions of the integrated circuit design.

9. A method comprising:
   accessing, from memory, an integrated circuit design comprising a clock net comprising a set of clock sinks;
   determining, using a machine-learning model, an initial number of clusters to generate from the set of clock sinks such that each cluster satisfies one or more design rule constraints;
   generating, using one or more processors of a machine, a first set of clusters by clustering the set of clock sinks of the clock net, the first set of clusters comprising the initial number of clusters;
   adjusting the initial number of clusters based on whether each cluster in the first set of clusters satisfies one or more design rule constraints, the adjusting of the initial number of clusters comprising decrementing the initial number of clusters based on determining each cluster in the set of clusters satisfies the one or more design rule constraints, the adjusting of the initial number of clusters resulting in an adjusted number of clusters;
   generating a clustering solution for the clock net based on the adjusted number of clusters; and
   generating a layout instance based on the clustering solution, the layout instance defining physical layout dimensions of the integrated circuit design.

10. The method of claim 9, wherein the adjusting the initial number of clusters comprises:
    determining whether each cluster in the first set of clusters satisfies the one or more design rule constraints based on a timing analysis.

11. The method of claim 9, wherein:
    the adjusting the initial number of clusters further comprises:

generating a second set of clusters comprising a second number of clusters, the second number of clusters resulting from decrementing the initial number of clusters; and based on determining each cluster in the second set of clusters satisfies the one or more design rule constraints, decrementing the second number of clusters.

12. The method of claim 11, wherein the adjusting the initial number of clusters further comprises:

generating a third set of clusters comprising a third number of clusters, the third number of clusters resulting from decrementing the second number of clusters;

determining at least one cluster in the third set of clusters fails to satisfy the one or more design rule constraints based on a subsequent timing analysis; and based on determining that at least one cluster in the third set of clusters fails to satisfy the one or more design rule constraints, selecting the second number of clusters as the adjusted number of clusters.

13. The method of claim 9, further comprising generating the machine-learning model by using one or more machine-learning algorithms to analyze training data to find correlations among a set of identified features that affect whether clusters satisfy design rule constraints.

14. The method of claim 13, wherein:

the training data comprises clusters of clock sinks that are labeled according to respective satisfaction of the design rule constraints; and the set of identified features include one or more of: driver location, driver size, input slew of driver, number of sinks, sink sizes, sink locations, bounding box area, average clock net radius, routing topology, total wirelength, and resistance and capacitance characteristics.

15. The method of claim 9, wherein the one or more design rule constraints comprise at least one timing target.

16. A system comprising:

one or more processors of a machine; and a computer storage medium storing instructions, which when executed by the machine, cause the machine to perform operations comprising:

accessing, from memory, an integrated circuit design comprising a clock net comprising a set of clock sinks;

determining, using a machine-learning model, an initial number of clusters to generate from the set of clock sinks such that each cluster satisfies one or more design rule constraints;

generating a first set of clusters from the set of clock sinks of the clock net, the first set of clusters comprising the initial number of clusters;

performing an initial timing analysis to evaluate the first set of clusters to determine whether each cluster in the first set of clusters satisfies the one or more design rule constraints;

determining an adjusted number of clusters based on a result of the initial timing analysis, the determining of the adjusted number of clusters comprises decrementing the initial number of clusters based on determining each cluster in the set of clusters satisfies the one or more design rule constraints;

generating a clustering solution for the clock net based on the adjusted number of clusters; and generating a layout instance based on the clustering solution, the layout instance defining physical layout dimensions of the integrated circuit design.

17. The system of claim 16, wherein the determining of the adjusted number of clusters further comprises:

generating a second set of clusters comprising a second number of clusters, the second number of clusters resulting from decrementing the initial number of clusters; and based on determining each cluster in the second set of clusters satisfies the one or more design rule constraints, decrementing the second number of clusters.

18. The system of claim 17, wherein the determining of the adjusted number of clusters further comprises:

generating a third set of clusters comprising a third number of clusters, the third number of clusters resulting from decrementing the second number of clusters;

determining at least one cluster in the third set of clusters fails to satisfy the one or more design rule constraints based on a subsequent timing analysis; and based on determining that at least one cluster in the third set of clusters fails to satisfy the one or more design rule constraints, selecting the second number of clusters as the adjusted number of clusters.

19. The system of claim 16, wherein:

the machine-learning model is generated by using one or more machine-learning algorithms to analyze training data to find correlations among a set of identified features that affect whether clusters satisfy design rule constraints;

the training data comprises clusters of clock sinks that are labeled according to respective satisfaction of the design rule constraints; and the set of identified features includes one or more of: driver location, driver size, input slew of driver, number of sinks, sink sizes, sink locations, bounding box area, average clock net radius, routing topology, total wirelength, and resistance and capacitance characteristics.

20. The system of claim 16, wherein the one or more design rule constraints comprise at least one timing target.

* * * * *